US008981484B2

(12) United States Patent
Sutardja et al.

(10) Patent No.: US 8,981,484 B2
(45) Date of Patent: Mar. 17, 2015

(54) BALLAST RESISTOR FOR SUPER-HIGH-VOLTAGE DEVICES

(75) Inventors: Sehat Sutardja, Los Altos Hills, CA (US); Ravishanker Krishnamoorthy, Singapore (SG); Siew Yong Chui, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/467,666

(22) Filed: May 9, 2012

(65) Prior Publication Data

US 2012/0326234 A1 Dec. 27, 2012

Related U.S. Application Data

(60) Provisional application No. 61/501,507, filed on Jun. 27, 2011.

(51) Int. Cl.
| H01L 23/62 | (2006.01) |
| H01L 29/78 | (2006.01) |
| H01L 29/66 | (2006.01) |
| H01L 29/08 | (2006.01) |

(52) U.S. Cl.
CPC ...... *H01L 29/7817* (2013.01); *H01L 29/66659* (2013.01); *H01L 29/66681* (2013.01); *H01L 29/7835* (2013.01); *H01L 29/0847* (2013.01); *H01L 29/0878* (2013.01); *H01L 2924/0002* (2013.01)
USPC ............. 257/358; 257/38; 257/355; 257/356; 257/360; 257/361; 257/363; 257/377; 257/380; 257/382; 361/56; 361/91.1

(58) Field of Classification Search
CPC ............ H01L 27/0248; H01L 27/0288; H01L 27/0292; H01L 27/0296
USPC ................. 257/355, 356, 358, 360, 361, 363, 257/E29.105, 377, 380, 382; 361/56, 91.1
See application file for complete search history.

(56) References Cited

U.S. PATENT DOCUMENTS

| 5,270,565 | A | * | 12/1993 | Lee et al. ....................... 257/358 |
| 6,587,320 | B1 | * | 7/2003 | Russ et al. ....................... 361/56 |
| 7,646,063 | B1 | * | 1/2010 | Boyd et al. .................... 257/355 |
| 2003/0067040 | A1 | * | 4/2003 | Chen et al. .................... 257/360 |
| 2005/0167786 | A1 | | 8/2005 | Gill et al. |
| 2011/0073950 | A1 | * | 3/2011 | Tsutsumi et al. ............. 257/358 |
| 2011/0133273 | A1 | | 6/2011 | Shima |

FOREIGN PATENT DOCUMENTS

WO WO01/50533 7/2001

OTHER PUBLICATIONS

PCT International Search Report and Written Opinion for related Application No. PCT/US2012/040059; Dec. 13, 2012; 6 pages.

* cited by examiner

*Primary Examiner* — Matthew Landau
*Assistant Examiner* — Mark Hatzilambrou

(57) ABSTRACT

An integrated circuit (IC) including a well region of the IC having a first doping level and a plurality of semiconductor regions implanted in the well region. Each of the plurality of semiconductor regions has a second doping level. The second doping level is greater than the first doping level. A plurality of polysilicon regions are arranged on the plurality of semiconductor regions. The polysilicon regions are respectively connected to the semiconductor regions. The plurality of semiconductor regions is a drain of a metal-oxide semiconductor field-effect transistor (MOSFET).

14 Claims, 5 Drawing Sheets

BALLAST RESISTOR FOR SUPER-HIGH-VOLTAGE DEVICES

CROSS-REFERENCE TO RELATED APPLICATIONS

This application claims the benefit of U.S. Provisional Application No. 61/501,507, filed on Jun. 27, 2011. The disclosure of the above application is incorporated herein by reference in its entirety.

FIELD

The present disclosure relates generally to integrated circuits and more particularly to a method for realizing a resistor at a drain of a super-high-voltage (SHV) metal-oxide semiconductor field-effect transistors (MOSFETs) to protect from electrostatic discharge (ESD).

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Devices such as metal-oxide semiconductor field-effect transistors (MOSFETs) can be damaged due to electrostatic discharge (ESD). To protect MOSFETs in an integrated circuit (IC) from ESD, additional circuitry may be used externally or internally to the IC.

A super-high-voltage (SHV) MOSFET occupies a much larger die area in an IC than low-power MOSFETs. Accordingly, adding circuitry in the IC to protect the SHV MOSFET from ESD consumes additional die area in the IC, which is undesirable. The SHV MOSFETs therefore need to be self-protecting. That is, the SHV MOSFET in the IC needs to protect itself from ESD without the additional ESD protecting circuitry in the IC.

SUMMARY

An integrated circuit (IC) including a well region of the IC having a first doping level and a plurality of semiconductor regions implanted in the well region. Each of the plurality of semiconductor regions has a second doping level. The second doping level is greater than the first doping level. A plurality of polysilicon regions are arranged on the plurality of semiconductor regions. The polysilicon regions are respectively connected to the semiconductor regions. The plurality of semiconductor regions is a drain of a metal-oxide semiconductor field-effect transistor (MOSFET).

In other features, the well region and the plurality of semiconductor regions have a first type of doping, where the well region is arranged on a substrate having a second type of doping, and where the second type of doping is opposite to the first type of doping.

In other features, the plurality of semiconductor regions is arranged along an axis, each of the plurality of polysilicon regions has a length and a width, the length is greater than the width, and the length extends along the axis.

In other features, the plurality of semiconductor regions is arranged along an axis, each of the plurality of polysilicon regions has a length and a width, the width is greater than the length, and the width is perpendicular to the axis.

In other features, the plurality of polysilicon regions have a resistance of at least one Ohm.

In other features, the plurality of polysilicon regions protect the MOSFET from electrostatic discharge.

In still other features, an integrated circuit (IC) includes a well region of the IC having a first type of doping and a first doping level, where the well region is arranged on a substrate having a second type of doping, and where the second type of doping is opposite to the first type of doping. A plurality of semiconductor regions is implanted in the well region, where each of the plurality of semiconductor regions has the first type of doping and a second doping level, and where the second doping level is greater than the first doping level. A plurality of polysilicon regions is respectively connected to the plurality of semiconductor regions. The plurality of semiconductor regions is a drain of a metal-oxide semiconductor field-effect transistor (MOSFET).

In other features, the plurality of semiconductor regions is arranged along an axis, each of the plurality of polysilicon regions has a length and a width, the length is greater than the width, and the length extends along the axis.

In other features, the plurality of semiconductor regions is arranged along an axis, each of the plurality of polysilicon regions has a length and a width, the width is greater than the length, and the width is perpendicular to the axis.

In other features, the plurality of polysilicon regions have a resistance of at least one Ohm.

In other features, the plurality of polysilicon regions protect the MOSFET from electrostatic discharge.

In still other features, a metal-oxide semiconductor field-effect transistor (MOSFET) integrated circuit (IC) includes a plurality of drain regions of the MOSFET IC, where the plurality of drain regions includes a plurality of semiconductor regions having a first doping level, where the plurality of semiconductor regions is implanted in a well region having a second doping level, and where the first doping level is greater than the second doping level. A plurality of resistors is respectively connected to the plurality of drain regions, where the plurality of resistors includes a plurality of polysilicon regions respectively arranged on the plurality of semiconductor regions in the MOSFET IC.

In other features, the MOSFET IC further includes the well region, where the plurality of semiconductor regions and the well region have a first type of doping, where the well region is arranged on a substrate having a second type of doping, and where the second type of doping is opposite to the first type of doping.

In other features, the plurality of semiconductor regions is arranged along an axis, each of the plurality of polysilicon regions has a length and a width, the length is greater than the width, and the length extends along the axis.

In other features, the plurality of semiconductor regions is arranged along an axis, each of the plurality of polysilicon regions has a length and a width, the width is greater than the length, and the width is perpendicular to the axis.

In other features, the plurality of resistors have a resistance of at least one Ohm.

In other features, the plurality of resistors protect the MOSFET IC from electrostatic discharge.

In still other features, a method includes implanting a plurality of semiconductor regions having a first doping level in a well region of an integrated circuit, where the well regions has a second doping level, and where the first doping level is greater than the second doping level. The method further includes arranging a plurality of polysilicon regions on the plurality of semiconductor regions in the integrated circuit and connecting the plurality of polysilicon regions respectively to the plurality of semiconductor regions.

In other features, each of the plurality of polysilicon regions has a length and a width, and where the length is greater than the width. The method further includes arranging the plurality of semiconductor regions along an axis and arranging lengths of the plurality of polysilicon regions parallel to the axis.

In other features, each of the plurality of polysilicon regions has a length and a width, and where the width is greater than the length. The method further includes arranging the plurality of semiconductor regions along an axis and arranging widths of the plurality of polysilicon regions perpendicular to the axis.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Self-protection of super-high-voltage (SHV) metal-oxide semiconductor field-effect transistors (MOSFETs) from electrostatic discharge (ESD) can be problematic. For example, since the size of a SHV MOSFET is large relative to a low-power MOSFET, the structure of the SHV MOSFET may not be uniform due to process variations. Consequently, different portions of the SHV MOSFET may breakdown at different ESD voltages. A portion having the lowest breakdown voltage turns on as soon as the ESD voltage reaches the lowest breakdown voltage, carries all the current, and burns, which renders the SHV MOSFET useless. The variation or spread in the breakdown voltages among different portions of the SHV MOSFET can be proportional to the size of the SHV MOSFET.

Figure 1:
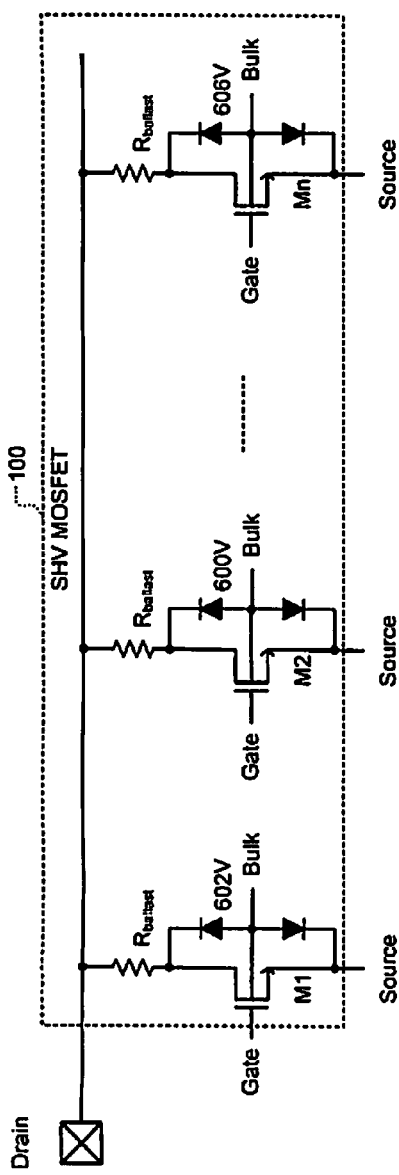
FIG. 1 is a schematic of super-high-voltage (SHV) metal-oxide semiconductor field-effect transistors (MOSFETs) with ballast resistors.

Referring now to FIG. 1, a SHV MOSFET 100 includes a plurality of constituent MOSFETs M1, M2, . . . , and Mn connected in parallel, where n is an integer greater than 1. To account for the spread in the breakdown voltages and evenly distribute energy from ESD across the SHV MOSFET 100, a plurality of ballast resistors ($R_{ballast}$) is added to the SHV MOSFET 100 as shown. Specifically, a ballast resistor $R_{ballast}$ is added between a drain pin (or a drain terminal) of the SHV MOSFET 100 and a drain of each of the constituent MOSFETs M1, M2, . . . , and Mn.

The ballast resistors prevent the MOSFET with the lowest breakdown voltage from turning on as follows. Suppose, for example only, that the average breakdown voltage of the SHV MOSFET 100 is 600V. A 1% variation can result in a difference of up to 6V from 600V. Accordingly, the MOSFET M1 may breakdown at 602V; the MOSFET M2 may break down at 600V, . . . , and the MOSFET Mn may breakdown at 606V. When an ESD event occurs, the ESD voltage at the drain pin of the SHV MOSFET 100 increases from 0V.

As the ESD voltage at the drain pin of the SHV MOSFET 100 approaches 600V, at 599V for example, none of the MOSFETs M1, M2, . . . , and Mn turns on. However, leakage currents are flowing through the MOSFETs M1, M2, . . . , and Mn. These leakage currents generate voltage drops across the ballast resistors connected to the drains of the MOSFETs M1, M2, . . . , and Mn. A leakage current through a MOSFET, and consequently a voltage drop across the ballast resistor connected to the drain of the MOSFET, increases as the voltage at the drain pin of the SHV MOSFET 100 approaches the breakdown voltage of the MOSFET.

For example, when the voltage at the drain pin of the SHV MOSFET 100 approaches 599V, which is close to the breakdown voltage of the MOSFET M2 (600V), a higher leakage current flowing through the MOSFET M2 generates a voltage drop across the ballast resistor connected to the drain of the MOSFET M2. The voltage drop may increase the voltage at the drain pin of the SHV MOSFET 100 to 602V.

When the voltage at the drain pin of the SHV MOSFET 100 nears 602V, which is close to the breakdown voltage of the MOSFET M1 (602V), a higher leakage current flows through the MOSFET M1. Since the MOSFET M1 begins conducting a higher leakage current, the MOSFET M1 provides an additional path for the current to flow should the MOSFET M2 turn on. In other words, the MOSFET M1 diverts (i.e., provides a path for) some of the current flowing through the MOSFET M2 as the MOSFET M2 nears turn-on due to the increased voltage at the drain pin of the SHV MOSFET 100. Effectively, this prevents (or delays) the MOSFET M2 from turning on although the voltage at the drain pin of the SHV MOSFET 100 exceeds the breakdown voltage of the MOSFET M2 (600V).

The leakage current flowing through the ballast resistor connected to the drain of the MOSFET M1 generates a voltage drop across the ballast resistor connected to the drain of the MOSFET M1. The voltage drop may increase the voltage at the drain pin of the SHV MOSFET 100 to more than 602V, which causes a higher leakage current to flow through another one of the MOSFETs, and which diverts some of the current from flowing through the MOSFETs M1 and M2. This prevents (or delays) the MOSFET M1 from turning on although the voltage at the drain pin of the SHV MOSFET 100 exceeds the breakdown voltage of the MOSFET M1 (602V). At this point, the MOSFET M2 may be close to being turned on.

This process continues until the voltage at the drain pin of the SHV MOSFET 100 increases to nearly 606V, and a higher leakage current flows through the MOSFET Mn, which diverts some of the current from flowing through the MOSFETs M1, M2, etc. At this point, the MOSFET M2 may be very close to being turned on, the MOSFET M1 may be close to being turned on, and so on.

Effectively, the turn-on times of the MOSFETs M1, M2, . . . , and Mn are synchronized due to the voltage drops across the ballast resistors connected to the drains of the MOSFETs M1, M2, . . . , and Mn. Accordingly, when the voltage at the drain pin of the SHV MOSFET 100 exceeds 606V, the MOSFETs M1, M2, . . . , and Mn turn on in quick succession, which may be considered nearly concurrent, and the current flowing through the drain of the SHV MOSFET 100 is distributed through all of the MOSFETs M1, M2, . . . , and Mn. This prevents only one of the MOSFETs M1, M2, . . . , and Mn having the lowest breakdown voltage (e.g., MOSFET M2) from turning on, carrying all the current, and malfunctioning.

Figure 2:
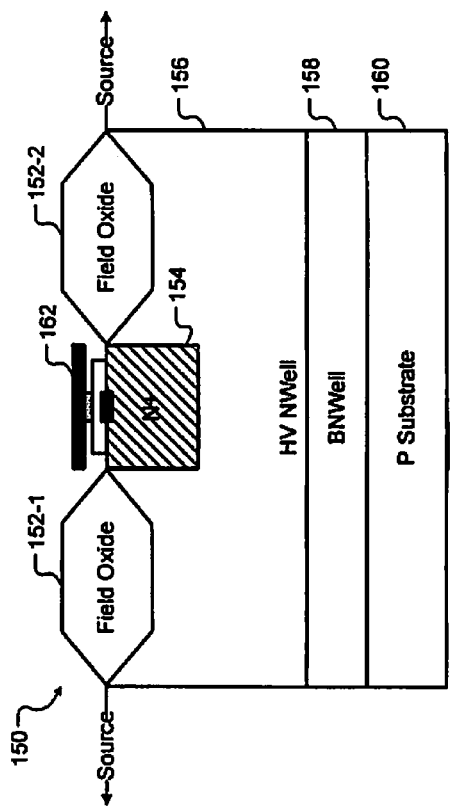
FIG. 2 is a cross-section of layout of a drain region of a SHV MOSFET without ballast resistors.

Referring now to FIG. 2, a cross-section of a layout of a drain region of a SHV MOSFET 150 without a ballast resistor is shown. In the drain region of the SHV MOSFET 150, an oxide layer is split into two portions 152-1 and 152-2 (collectively oxide layer 152), and an N+ drain region 154 is implanted in a high-voltage N well 156. The doping level of the N+ drain region 154 is greater than the doping level of the high-voltage N well 156. A buried N well 158 is optionally arranged between the high-voltage N well 156 and a P substrate 160. The high-voltage N well 156 and/or the buried N well 158 is arranged on the P substrate 160. Note that the polarities of doping materials may be reversed (i.e., N to P, P to N, N+ to P+, and so on).

A metal layer 162 is arranged above the N+ drain region 154. The high-voltage N well 156 can withstand a voltage greater than a breakdown voltage of the oxide layer 152. Therefore, the metal layer 162 and the drain of the SHV MOSFET 150 can withstand a voltage greater than the breakdown voltage of the oxide layer 152.

It is well known to add a ballast resistor to the drain of the MOSFET to distribute the current. However, in a typical SHV process, only metal connections are allowed in the drain region, for example between 152-1 and 152-2 in FIG. 3A. This limitation is due to the high voltage present at the drain of the MOSFET 154. Typical metal resistors are in milli-Ohm range, and it is not practical to realize a metal resistor with larger resistance and high current capability. For effective ballast protection, the resistors need to be in the range of few Ohms.

The present disclosure describes a method to realize a resistor in the region of few Ohms using polysilicon, which can provide adequate protection.

One way to arrange a ballast resistor connected to the drain of the SHV MOSFET 150 is to extend the metal layer 162 over the oxide layer 152. For example, the metal layer 162 can be extended to the right of the portion 152-2 of the oxide layer 152 or to the left of the portion 152-1 of the oxide layer 152. In addition, only the respective portion of the oxide layer 152 is extended along the metal layer 162. The high-voltage N well 156 is not extended below the respective portion of the oxide layer 152. Accordingly, there is no high-voltage N well 156 below the extended portion 152-1 or 152-2 of the oxide layer 152. Consequently, the resistor formed by the extended metal layer 162, and the portion of the oxide layer 152 extended below the resistor will both break down at the breakdown voltage of the oxide layer 152.

Therefore, the resistor needs to be arranged above the N+ drain region 154 so that the high-voltage N well 156 is present below the resistor to prevent the resistor from breaking down at the breakdown voltage of the oxide layer 152. The present disclosure proposes different arrangements of a plurality of polysilicon regions above the N+ drain region 154. In these arrangements, the plurality of polysilicon regions is arranged directly on top of a plurality of portions of the N+ drain region 154 to form a plurality of ballast resistors. Specifically, the plurality of polysilicon regions is arranged over the N+ drain region 154 of the MOSFET 150 and between the two oxide layer portions 152-1 and 152-2 of the MOSFET 150 as explained below.

Arranging polysilicon regions above the N+ drain region 154, however, degenerates the conductivity of the N+ drain region 154, which increases the resistance of the N+ drain region 154. This phenomenon normally makes arranging polysilicon regions above the N+ drain region 154 undesirable. In the present application, however, this phenomenon is desirable because the additional resistivity of a degenerated N+ drain region 154 increases the total resistance offered by the polysilicon regions and the degenerated N+ drain region 154. The values of the combined resistances offered by the polysilicon regions and the degenerated N+ drain region 154 can be estimated by estimating the degeneration of the N+ drain region 154 due to the polysilicon regions.

Referring now to FIGS. 3A-3D, a plurality of ballast resistors can be realized by arranging polysilicon over the drain region in different ways. Specifically, a plurality of polysilicon layers is arranged above a plurality of portions of the N+ drain region 154, which is implanted in the high-voltage N well 156.

Figure 3A:
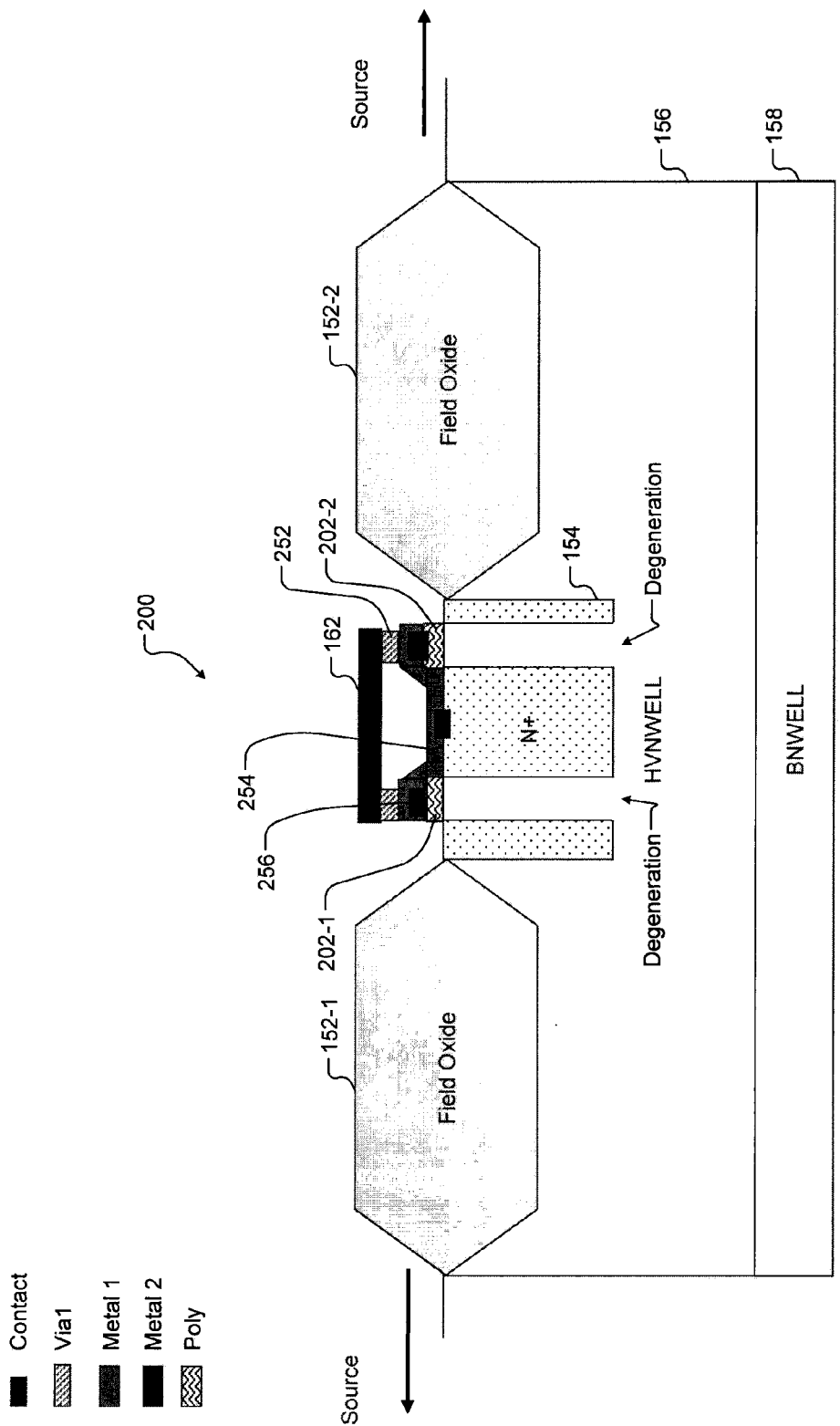
FIG. 3A is a cross-section of a layout of a drain region of a SHV MOSFET with polysilicon arranged in the drain region according to a first arrangement to provide ballast resistors.
Figure 3B:
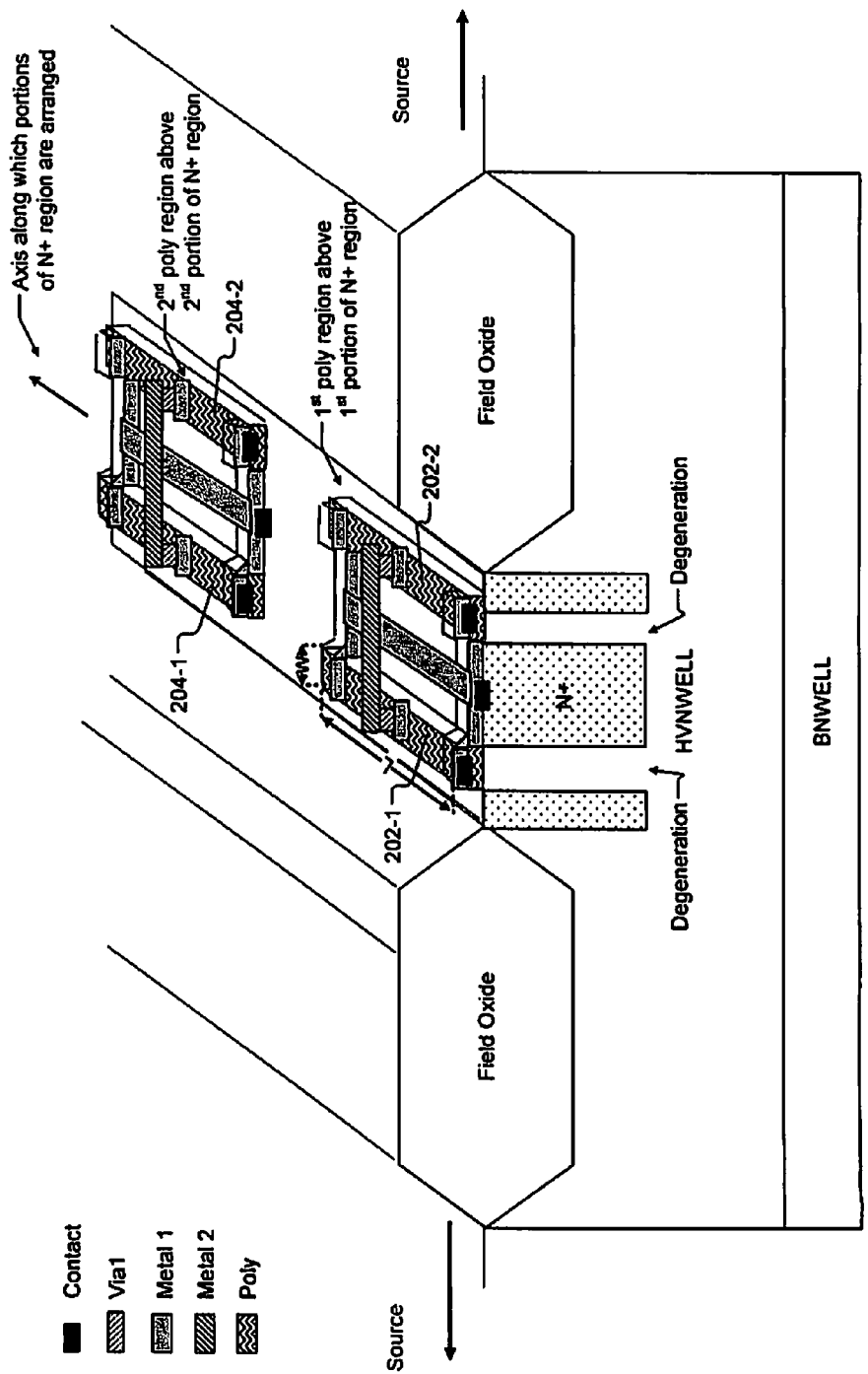
FIG. 3B depicts details of a plurality of polysilicon regions arranged in the drain region according to the first arrangement.

In FIGS. 3A and 3B, a cross-section of a layout of a drain region of a SHV MOSFET 200 with a plurality of ballast resistors according to a first arrangement is shown. Description of elements that are similar to the elements shown in FIG. 2 is omitted. The P substrate 160 is omitted for simplicity of illustration.

In FIG. 3A, reference numerals 252, 254, and 256 respectively denote Via1, Metal 1, and Contact shown in the legend.

In FIG. 3A, a plurality of polysilicon regions are arranged above the N+ drain region 154, of which only a first polysilicon region comprising elements 202-1 and 202-2 is visible in the cross-sectional view. In FIG. 3B, a second polysilicon region comprising elements 204-1 and 204-2 is shown. While only two polysilicon regions are shown, additional polysilicon regions are contemplated. Each polysilicon region is arranged above a corresponding portion of the N+ drain region 154. The portions of the N+ drain region 154 are arranged along an axis and extend along (i.e., parallel to) the axis.

Each polysilicon region extends along (i.e., parallel to) the axis. Specifically, each element of a polysilicon region is elongated and extends lengthwise along the axis. More specifically, a length L of an element of a polysilicon region (e.g., element 202-1) extends along the axis and is greater than a width W of the element of the polysilicon region.

The high-voltage N well 156, the optional buried N well 158, and the P substrate 160 are also arranged and extend along the axis along which the portions of the N+ drain region 154 are arranged and extend. The degeneration of the N+ drain region 154 due to polysilicon extends along the axis as well.

The first polysilicon region provides a first ballast resistor. The first ballast resistor is connected to a first portion of the N+ drain region 154, which forms a first drain region of a first MOSFET of the SHV MOSFET 200. The second polysilicon region provides a second ballast resistor. The second ballast resistor is connected to a second portion of the N+ drain region 154, which forms a second drain region of a second MOSFET of the SHV MOSFET 200, and so on.

Figure 3C:
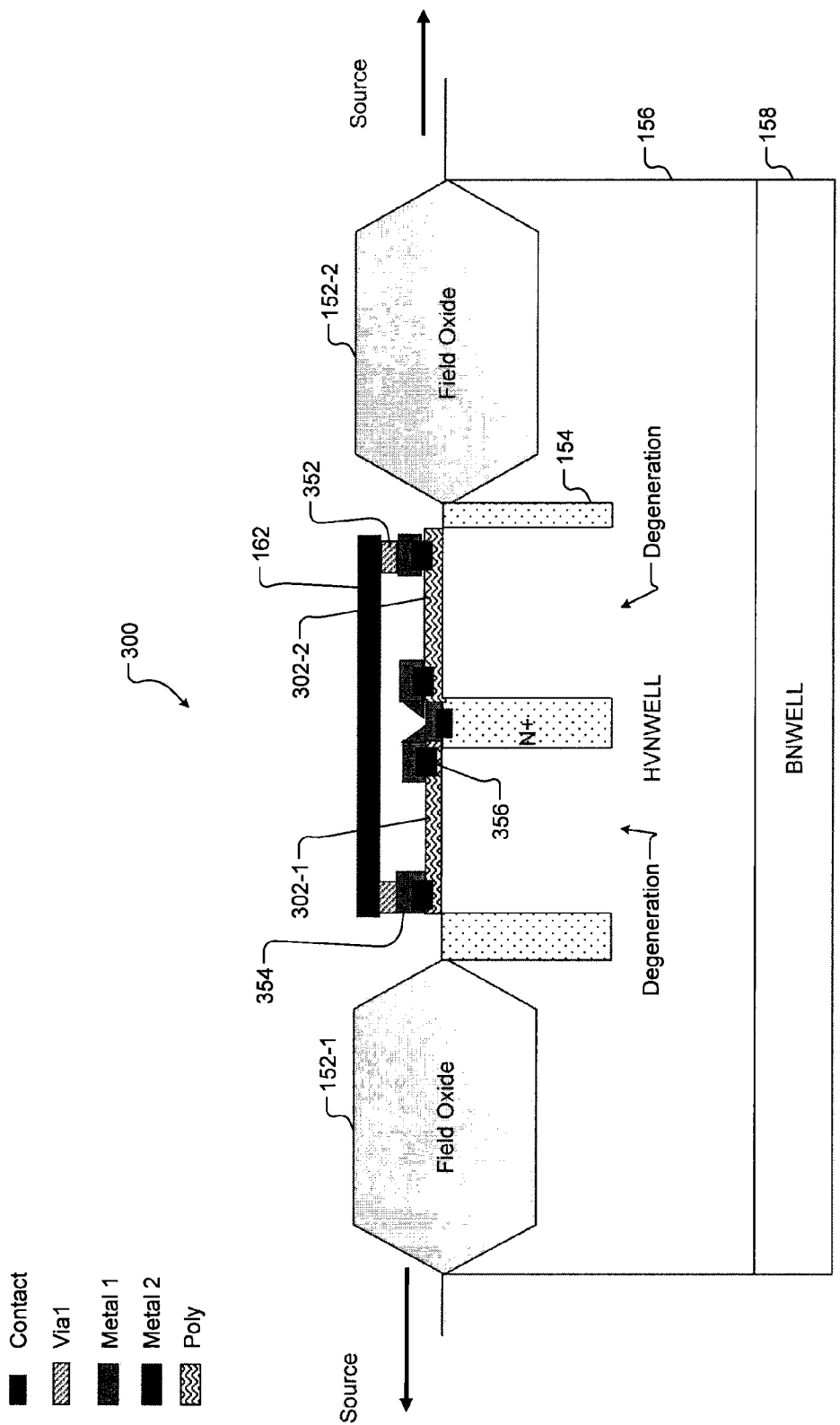
FIG. 3C is a cross-section of a layout of a drain region of a SHV MOSFET with polysilicon arranged in the drain region according to a second arrangement to provide ballast resistors.
Figure 3D:
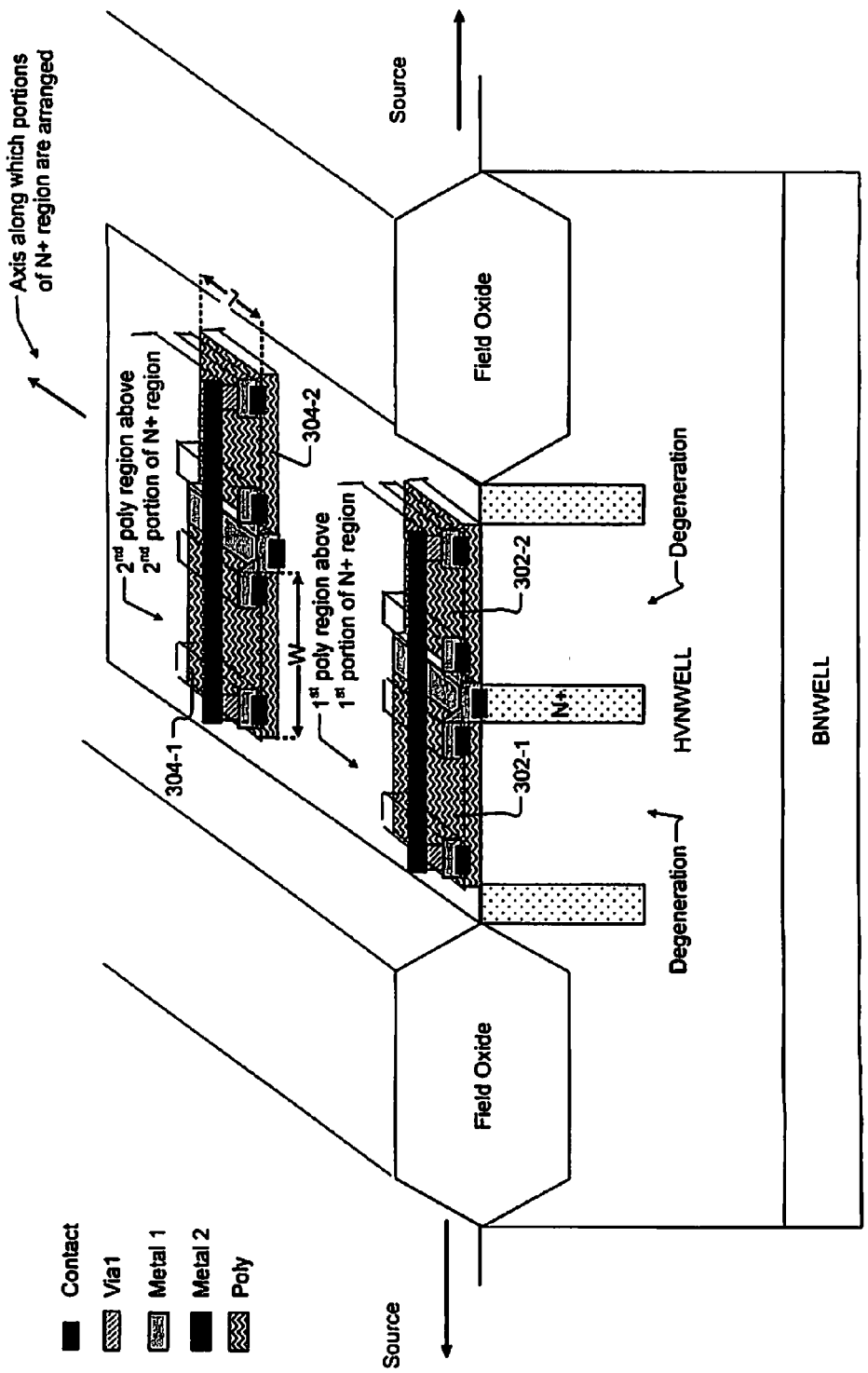
FIG. 3D depicts details of a plurality of polysilicon regions arranged in the drain region according to the second arrangement.

In FIGS. 3C and 3D, a cross-section of a layout of a drain region of a SHV MOSFET 300 with a plurality of ballast resistors according to a second arrangement is shown. Description of elements that are similar to the elements shown in FIG. 2 is omitted. The P substrate 160 is omitted for simplicity of illustration.

In FIG. 3C, reference numerals 162, 352, 354, and 356 respectively denote Metal 2, Via1, Metal 1, and Contact shown in the legend.

In FIG. 3C, a plurality of polysilicon regions are arranged above the N+ drain region 154, of which only a first polysilicon region comprising elements 302-1 and 302-2 is visible in the cross-sectional view. In FIG. 3O, a second polysilicon region comprising elements 304-1 and 304-2 is shown. While only two polysilicon regions are shown, additional polysilicon regions are contemplated. Each polysilicon region is arranged above a corresponding portion of the N+ drain region 154. The portions of the N+ drain region 154 are arranged and extend along an axis.

Each polysilicon region extends perpendicularly to the axis. Specifically, each polysilicon region is elongated perpendicular to the axis. More specifically, a combined width 2W of a polysilicon region (i.e., a sum of widths W of each of the two elements of a polysilicon region) extends perpendicularly to the axis and is greater than a length L of the polysilicon region.

The high-voltage N well 156, the optional buried N well 158, and the P substrate 160 are arranged and extend along the axis along which the portions of the N+ drain region 154 are arranged and extend. The degeneration of the N+ drain region 154 due to polysilicon extends along the axis as well.

The degeneration of the N+ drain region 154 when the polysilicon is arranged according to the second arrangement is greater than the degeneration of the N+ drain region 154 when the polysilicon is arranged according to the first arrangement. Due to greater degeneration, the N+ drain region 154 offers greater resistance when the polysilicon is arranged according to the second arrangement than when the polysilicon is arranged according to the first arrangement.

The first polysilicon region provides a first ballast resistor. The first ballast resistor is connected to a first portion of the N+ drain region 154, which forms a first drain region of a first MOSFET of the SHV MOSFET 300. The second polysilicon region provides a second ballast resistor. The second ballast resistor is connected to a second portion of the N+ drain region 154, which forms a second drain region of a second MOSFET of the SHV MOSFET 300, and so on.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. An integrated circuit (IC), comprising:
    a well region of the IC having a first doping level;
    a plurality of semiconductor regions implanted in the well region, wherein each of the plurality of semiconductor regions has a second doping level, and wherein the second doping level is greater than the first doping level; and
    a plurality of polysilicon regions arranged on each of the plurality of semiconductor regions, wherein the polysilicon regions are respectively connected directly to the plurality of semiconductor regions, and wherein the plurality of polysilicon regions have a resistance of at least one Ohm,
    wherein arranging the plurality of polysilicon regions on each of the plurality of semiconductor regions degenerates conductivity and increases resistivity of the plurality of semiconductor regions,
    wherein the plurality of semiconductor regions forms a drain of a high-voltage metal-oxide semiconductor field-effect transistor (MOSFET), and
    wherein the high-voltage MOSFET has a higher voltage rating and size than a low-power signal MOSFET.

2. The IC of claim 1, wherein the well region and the plurality of semiconductor regions have a first type of doping, wherein the well region is arranged on a substrate having a second type of doping, and wherein the second type of doping is opposite to the first type of doping.

3. The IC of claim 1, wherein the plurality of semiconductor regions is arranged along an axis, wherein each of the plurality of polysilicon regions has a length and a width, wherein the length is greater than the width, and wherein the length extends along the axis.

4. The IC of claim 1, wherein the plurality of semiconductor regions is arranged along an axis, wherein each of the plurality of polysilicon regions has a length and a width, wherein the width is greater than the length, and wherein the width is perpendicular to the axis.

5. The IC of claim 1, wherein the plurality of polysilicon regions protect the MOSFET from electrostatic discharge.

6. An integrated circuit (IC), comprising:
    a well region of the IC having a first type of doping and a first doping level, wherein the well region is arranged on a substrate having a second type of doping, and wherein the second type of doping is opposite to the first type of doping;
    a plurality of semiconductor regions implanted in the well region, wherein each of the plurality of semiconductor regions has the first type of doping and a second doping level, and wherein the second doping level is greater than the first doping level; and
    a plurality of polysilicon regions arranged on each of the plurality of semiconductor regions, wherein the polysilicon regions are respectively connected directly to the plurality of semiconductor regions, wherein the plurality of polysilicon regions have a resistance of at least one Ohm,
    wherein arranging the plurality of polysilicon regions on each of the plurality of semiconductor regions degenerates conductivity and increases resistivity of the plurality of semiconductor regions,
    wherein the plurality of semiconductor regions forms a drain of a high-voltage metal-oxide semiconductor field-effect transistor (MOSFET), and
    wherein the high-voltage MOSFET has a higher voltage rating and size than a low-power signal MOSFET.

7. The IC of claim 6, wherein the plurality of semiconductor regions is arranged along an axis, wherein each of the plurality of polysilicon regions has a length and a width, wherein the length is greater than the width, and wherein the length extends along the axis.

8. The IC of claim 6, wherein the plurality of semiconductor regions is arranged along an axis, wherein each of the plurality of polysilicon regions has a length and a width, wherein the width is greater than the length, and wherein the width is perpendicular to the axis.

9. The IC of claim 6, wherein the plurality of polysilicon regions protect the MOSFET from electrostatic discharge.

10. A metal-oxide semiconductor field-effect transistor (MOSFET) integrated circuit (IC) comprising:
- a plurality of drain regions of the MOSFET IC, wherein the plurality of drain regions includes a plurality of semiconductor regions having a first doping level, wherein the plurality of semiconductor regions is implanted in a well region having a second doping level, and wherein the first doping level is greater than the second doping level; and
- a plurality of resistors respectively connected to the plurality of drain regions, wherein the plurality of resistors includes a plurality of polysilicon regions respectively arranged on each of the plurality of semiconductor regions in the MOSFET IC, wherein the plurality of polysilicon regions are respectively connected directly to the plurality of semiconductor regions, and wherein the plurality of polysilicon regions have a resistance of at least one Ohm,
- wherein arranging the plurality of polysilicon regions on each of the plurality of semiconductor regions degenerates conductivity and increases resistivity of the plurality of semiconductor regions,
- wherein the MOSFET IC is a high-voltage MOSFET IC having a higher voltage rating and size than a low-power signal MOSFET IC.

11. The MOSFET IC of claim 10, further comprising the well region, wherein the plurality of semiconductor regions and the well region have a first type of doping, wherein the well region is arranged on a substrate having a second type of doping, and wherein the second type of doping is opposite to the first type of doping.

12. The MOSFET IC of claim 10, wherein the plurality of semiconductor regions is arranged along an axis, wherein each of the plurality of polysilicon regions has a length and a width, wherein the length is greater than the width, and wherein the length extends along the axis.

13. The MOSFET IC of claim 10, wherein the plurality of semiconductor regions is arranged along an axis, wherein each of the plurality of polysilicon regions has a length and a width, wherein the width is greater than the length, and wherein the width is perpendicular to the axis.

14. The MOSFET IC of claim 10, wherein the plurality of resistors protect the MOSFET IC from electrostatic discharge.

* * * * *